US00RE36087E

United States Patent [19]

Horch

[11] E Patent Number: Re. 36,087

[45] Reissued Date of Patent: Feb. 9, 1999

[54] METHOD AND SYSTEM FOR DECOUPLING INOPERATIVE PASSIVE ELEMENTS ON A SEMICONDUCTOR CHIP

[75] Inventor: Andrew Horch, Austin, Tex.

[73] Assignee: Micron Technology, Inc., Boise, Id.

[21] Appl. No.: 680,569

[22] Filed: Jul. 12, 1996

Related U.S. Patent Documents

Reissue of:

[64] Patent No.: 5,329,237
Issued: Jul. 12, 1994
Appl. No.: 16,910
Filed: Feb. 12, 1993

[51] Int. Cl.[6] ..... G01R 31/02

[52] U.S. Cl. ..... 324/501; 324/527; 324/537; 324/548; 250/341.4; 361/67; 437/8

[58] Field of Search ..... 324/501, 527, 324/536, 537, 548; 250/340, 341.1, 341.4, 341.6; 361/67, 91; 437/8

[56] References Cited

U.S. PATENT DOCUMENTS

| | | | |
|---|---|---|---|
| 4,879,631 | 11/1989 | Johnson et al. | 361/386 |
| 5,032,892 | 7/1991 | Chern et al. | 357/51 |
| 5,047,826 | 9/1991 | Keller et al. | 357/42 |
| 5,134,539 | 7/1992 | Tuckerman et al. | 361/311 |
| 5,160,987 | 11/1992 | Pricer et al. | 257/307 |
| 5,270,655 | 12/1993 | Tomita | 324/158 R |
| 5,326,428 | 7/1994 | Farnworth et al. | 437/8 X |
| 5,381,103 | 1/1995 | Edmond et al. | 437/8 X |
| 5,422,498 | 6/1995 | Nikawa et al. | 324/501 X |
| 5,504,431 | 4/1996 | Maeda et al. | 324/501 |
| 5,568,054 | 10/1996 | Iino et al. | 324/537 X |

*Primary Examiner*—Glenn W. Brown
*Attorney, Agent, or Firm*—Trask, Britt & Rossa

[57] ABSTRACT

The present invention teaches a method and system for disconnecting shorted decoupling capacitors, wherein a semiconductor chip having a plurality of redundant decoupling capacitors. Each of the capacitors is coupled, by means of a link, to a bus having a predetermined voltage. Each link is accessible to light emissions, in planar view. The system comprises a tester for testing the operability of each of the capacitors. In a preferred embodiment, the tester comprises a heating element and a high voltage stress testing element. Under thermal and voltage stress, an infrared signal identifying shorted decoupling capacitors is generated by shorted decoupling capacitors. The system further comprises a sensor for sensing the infrared signal. In one embodiment of the present invention, the sensor comprises an emission microscope for multilevel inspection ("EMMI"). Each inoperable capacitor is decoupled from the bus by disintegrating the link with a laser in response to the infrared signal. In an alternate embodiment, the link is disintegrated by an acid etch comprising $H_2SO_4$, $H_2SO_4$ and $H_2O_2$, or $H_2PO_4$.

77 Claims, 3 Drawing Sheets

METHOD AND SYSTEM FOR DECOUPLING INOPERATIVE PASSIVE ELEMENTS ON A SEMICONDUCTOR CHIP

Matter enclosed in heavy brackets [ ] appears in the original patent but forms no part of this reissue specification; matter printed in italics indicates the additions made by reissue.

FIELD OF THE INVENTION

This invention relates to semiconductor devices and more particularly, to an improved method and system for decoupling inoperative passive redundant elements on a semiconductor chip.

BACKGROUND OF THE INVENTION

Semiconductor devices are essentially switching devices. The output drivers within these devices create an intermittent current flow through the circuit's bond wires and associated conductive traces. As such, voltage surges develop with the potential for creating logic errors. Other logic damaging transient voltages are caused by voltage fluctuations along the power line as well as the interaction of other circuit components within the system.

In order to abate the potential effect of transient voltages, decoupling capacitors are commonly employed. Referring to FIG. 1, a series of decoupling capacitors 20 are connected between a ground bus ($V_{SS}$ bus) 16 and a power bus ($V_{cc}$ bus) 14 of a semiconductor chip 10. The capacitance value of each decoupling capacitor 20 is high relatively, for example on the order of 1.6 nF to 1.8 nF, when compared with the values of the capacitors employed directly by semiconductor chip 10, for example in the range of 10 fF to 20 fF.

Several problems have arisen with regards to the failing of one or more decoupling capacitors. Decoupling capacitors are fabricated by sandwiching a dielectric layer between two conductive plates. However, in the event that a decoupling capacitor's dielectric layer fails, a short may arise, potentially destroying the semiconductor chip.

What is needed is a technique for disconnecting decoupling capacitors which have failed. Ideally, the step of disconnecting must avoid additional manufacturing and labor costs. Thus, a circuit design solution incorporated into current chip manufacturing processes is preferable. Additionally, the total chip decoupling capacitance must not be significantly altered in the event of a capacitor failure. Further, significant additional chip area must not be necessitated for disconnecting failed decoupling capacitors beyond the area required for conventional decoupling capacitors.

One solution to the shorting problem for decoupling capacitors has been proposed in U.S. Pat. No. 4,879,631 assigned to Micron Technology, Incorporated. The invention teaches placing multiple pairs of decoupling capacitors in series between the ground and power buses to dramatically reduce the possibility of destroying the semiconductor chip. However, the proposed approach of coupling two capacitors in series requires much more charge storage area to achieve the equivalent capacitance of a single capacitor. As utilizing space on semiconductor chips is costly, such a scheme is not always a feasible alternative for providing a decoupling capacitor system on the chip.

In another solution, a multitude of decoupling capacitors are connected in parallel between a $V_{cc}$ bus and a $V_{ss}$ bus of the semiconductor chip. At least one plate of each decoupling capacitor is connected to the bus by means of an electrically fusible link. The dimensions and characteristics of the electrically fusible link are such that, in the event that the decoupling capacitor associated therewith fails, the electrically fusible link will blow, thereby forming an open circuit and decoupling the capacitor from the remainder of the semiconductor chip. Thus, the decoupling of the electrically fusible link is dependent on internal stimulus in the chip's interaction, i.e, the generation of sufficient current to blow the fuse link.

Difficulties have also arisen in feasibly manufacturing an electrically fusible link. Further, the materials employed to form the electrically fusible link have shown poor sensitivity, tolerances, and a high rate of false triggers in disconnecting the decoupling capacitors. Under this approach, as no sensing mechanism is necessary to ascertain whether a decoupling capacitor has failed, several properly functioning decoupling capacitors can be accidentally disconnected from the bus. Further, by relying on an electrically fusible link, a decoupling capacitor can be disconnected from the chip at any time.

SUMMARY OF THE INVENTION

The primary object of the present invention is to eliminate the aforementioned drawbacks of the prior art.

Another object of the present invention is to provide a system and method for disconnecting inoperative decoupling capacitors, wherein the system and method are practicable within high volume semiconductor manufacturing.

A further object of the present invention is to provide a system and method for disconnecting inoperative decoupling capacitors that are cost effective to implement.

Still another object of the present invention is to provide a method for disconnecting inoperative decoupling capacitors that requires fewer process steps to accomplish.

Yet another object of the present invention is to provide a system for disconnecting inoperative decoupling capacitors that is subject to fewer false triggers of the step of disconnecting.

A further object of the present invention is to provide a more controlled method and system for disconnecting inoperative decoupling capacitors, wherein an inoperative decoupling capacitor can only be disconnected after burn in.

Still another object of the present invention is to provide a method and system for disconnecting inoperative decoupling capacitors that is performed by an external source, and, as such, is independent of any internal stimulus.

A further object of the present invention is to provide a method and system for disconnecting inoperative decoupling capacitors that adds no resistance to the impedance of the decoupling capacitors.

In order to achieve these objects, as well as others which will become apparent hereafter, a method and system for disconnecting inoperative, i.e. shorted, decoupling capacitors is disclosed, wherein a semiconductor chip includes a plurality of redundant decoupling capacitors. Each of the capacitors is coupled, by means of a link, to a bus having a predetermined voltage. Each link is directly accessible to light emissions, in planar view. Further, the system comprises a tester for testing the operability of each of the capacitors. In the preferred embodiment, the tester comprises a heating element for stressing the semiconductor chip to a temperature substantially in the range between 120° C. and 140° C. for a time substantially in the range between 1 hour and 48 hours. Furthermore, the tester comprises a high voltage stress testing element for stressing the chip between the $V_{CC}$ bus and the $V_{SS}$ bus at a voltage substantially between 7 Volts and 8 Volts for a time period substantially between 1 minute and 48 hours. In an alternate embodiment, the tester solely comprises a high voltage stress testing element for stressing the chip between the $V_{CC}$ bus and the $V_{SS}$ bus at a voltage substantially between 7 Volts and 8 Volts for a time period substantially between 1 minute and 48 hours. Under either stressing scheme, an infrared signal identifying shorted decoupling capacitors is generated after the chip is tested. The tester further comprises a sensor for sensing an infrared signal from any of the capacitors. In one embodiment of the present invention, the sensor comprises an emission microscope for multilevel inspection ("EMMI"). In the preferred embodiment, a laser is also employed for externally decoupling each inoperable capacitor from the bus by disintegrating the link in response to the infrared signal. In alternate embodiment, the link is disintegrated by an acid etch comprising $H_2SO_4$, $H_2SO_4$ and $H_2O_2$, or $H_2PO_4$.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that (he drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
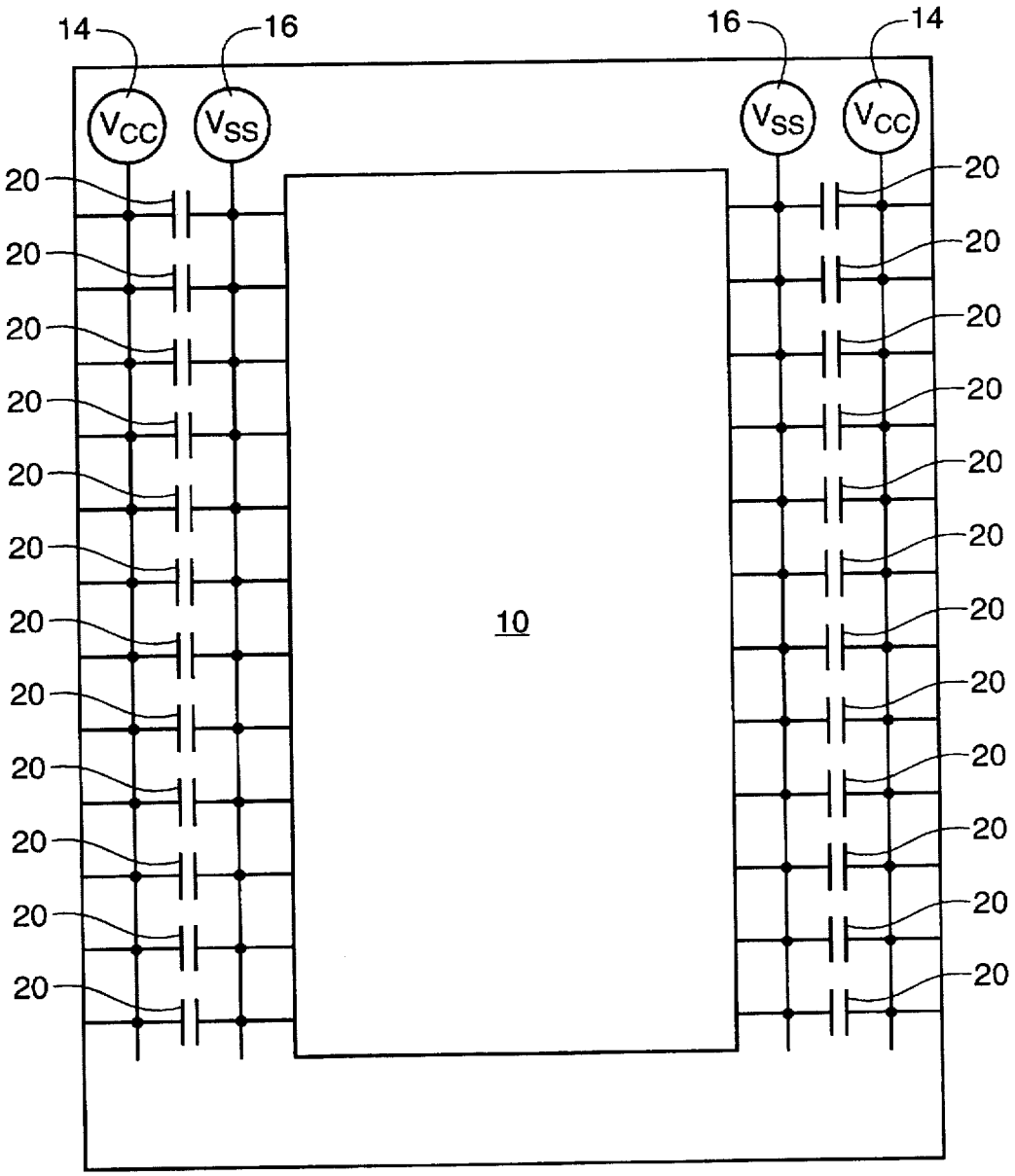
FIG. 1 (RELATED ART)
FIG. 1 is an illustration of a conventional semiconductor chip having a plurality of decoupling capacitors.
Figure 2:
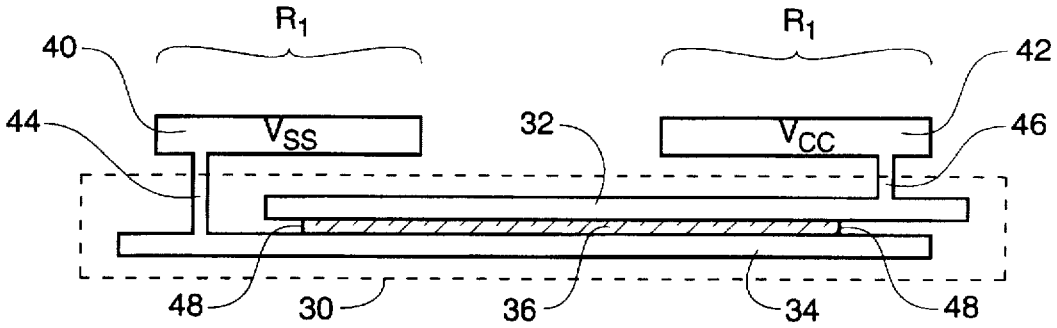
FIG. 2 (RELATED ART)
FIG. 2 is a cross-sectional perspective of a conventional decoupling capacitor.

Referring to FIG. 2, a cross-sectional perspective of a conventional decoupling capacitor 30 is illustrated. A plurality of decoupling capacitors 30 are employed on a semiconductor chip (not shown) to limit the potential for creating logic errors and damage. As such, capacitor 30 is coupled to the power buses of the chip: $V_{SS}$ bus 40 and $V_{CC}$ bus 42. Further, each power bus has a width $R_1$.

Decoupling capacitor 30 is fabricated from a dielectric layer sandwiched between two conductive layers or plates. The structural layout of capacitor 30 can best be understood from FIG. 2. First and second plate, 32 and 34, respectively, are physically positioned in parallel with respect to each other. Plates 32 and 34 are separated by a dielectric film 36, such that a plate is both superjacent and subjacent dielectric film 36.

Dielectric film 36 comprises either silicon dioxide or silicon nitride, for example. Film 36, however, can comprise any other element, compound, or material having sufficient dielectric characteristics to stably respond to the voltages applied over the chip's buses. Nonetheless, because of the functional purpose of film 36, its reliability is a fundamental issue to the overall reliability of the chip.

As described hereinabove, traditionally, each decoupling capacitor is coupled between two power buses, such as the $V_{SS}$ bus 40 and the $V_{CC}$ bus 42. In order to couple capacitor 30 to each bus, a first and second link, 44 and 46 (also referred to as a "via") are perpendicularly and conductively associated with plates 34 and 32, respectively. Both links, 44 and 46, emanate directly below $V_{SS}$ bus 40 and $V_{CC}$ bus 42, respectively, with a width substantially in the range of 0.1 to 1 micron. Both links, 44 and 46, are spaced sufficiently away from the edges 48 of dielectric film 36. Further, both links, 44 and 46, are conductively associated with buses 40 and 42, respectively.

Figure 3:
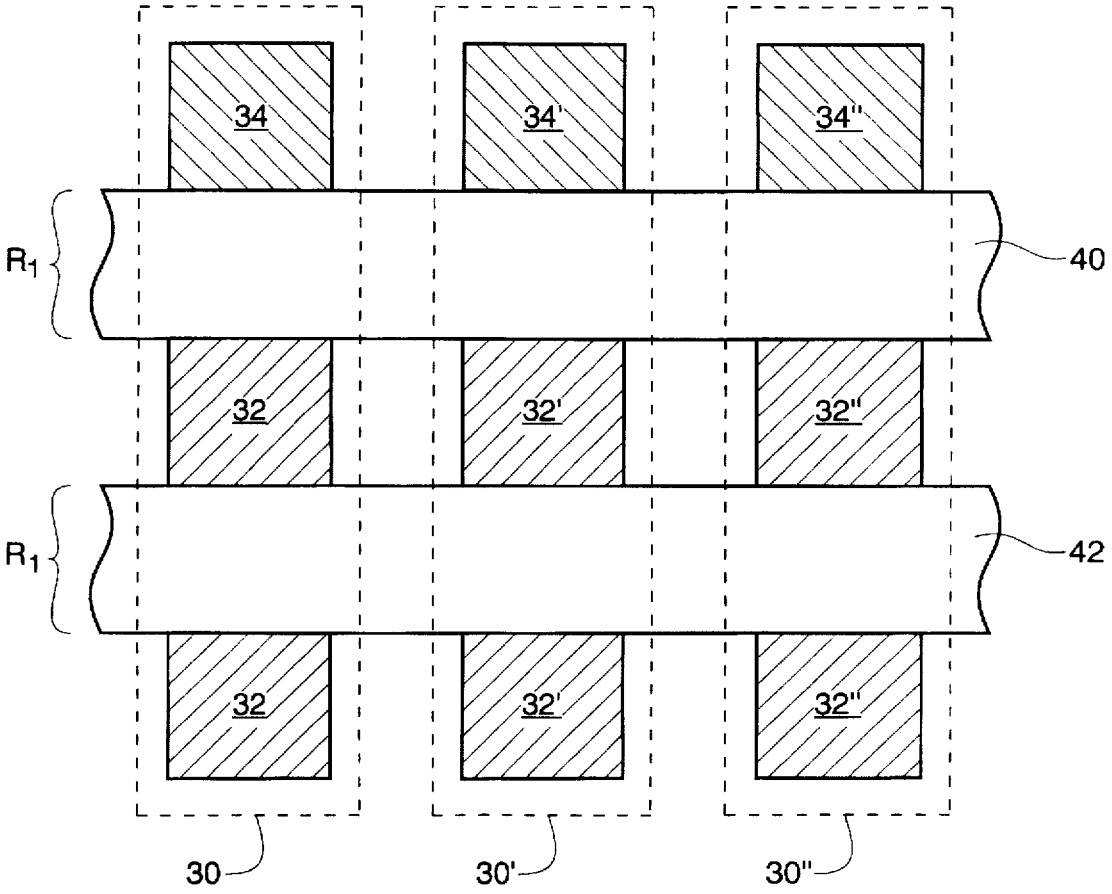
FIG. 3 (RELATED ART)
FIG. 3 is a top view of a conventional decoupling capacitor.

Referring to FIG. 3, a top view of three conventional capacitors is depicted. The three decoupling capacitors, 30, 30', and 30", are coupled to $V_{SS}$ bus 40 and $V_{CC}$ bus 42 in parallel. Each capacitor has a dielectric film (not shown), sandwiched between a first and second conductive plate, 32, 32', and 32", and 34, 34', and 34", respectively. Furthermore, $V_{SS}$ bus 40 and $V_{CC}$ bus 42, each having a width $R_1$, are connected to conductive plates, 34, 34', and 34", and 32, 32', and 32", respectively, by means of a link (not shown).

Figure 4:
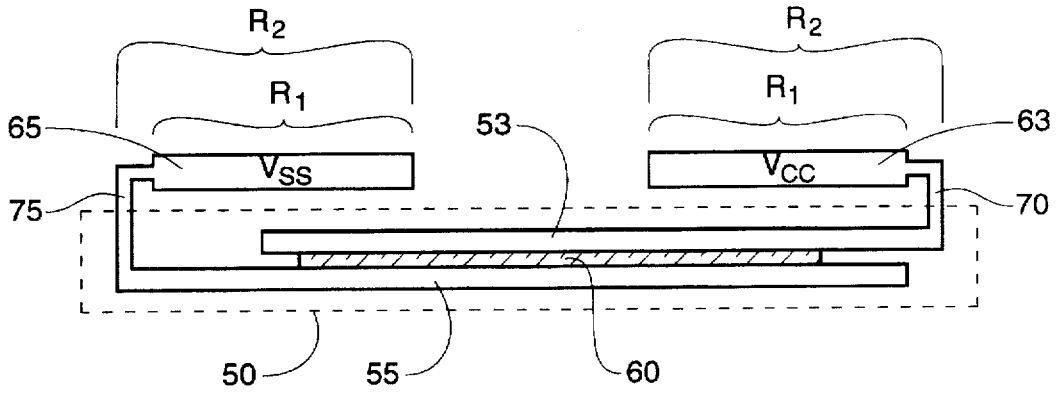
FIG. 4 is a cross-sectional perspective of a decoupling capacitor of the present invention.

Referring to FIG. 4, a cross-sectional perspective of a decoupling capacitor of the present invention is illustrated. A plurality of decoupling capacitors 50 are employed on a semiconductor chip (not shown) to limit the potential for creating logic errors and damage. As such, capacitor 50 is coupled to the $V_{SS}$ bus 65 and $V_{CC}$ bus 63.

Decoupling capacitor 50, as described above, is fabricated from a dielectric layer sandwiched between two conductive layers or plates. First and second plate, 53 and 55, respectively, are physically positioned in parallel with respect to each other. Both plates 53 and 55 are separated by a dielectric film 60, such that plate 53 is superjacent film 60 and plate 55 is subjacent film 60.

Dielectric film 60 comprises silicon dioxide or silicon nitride, for example. Film 60, however, can comprise any other element, compound, or material having sufficient dielectric characteristics to stably respond to the voltages applied over the chip's buses. Nonetheless, because of the functional purpose of film 60, its reliability is a fundamental issue to the overall reliability of the chip.

Moreover, each decoupling capacitor 50 employed is coupled between $V_{SS}$ bus 65 and $V_{CC}$ bus 63. In order to couple capacitor 50 to each bus, a first and second link, 70 and 75, are conductively associated with plates 53 and 55, respectively. The material employed to fabricate both links is of minimal resistance so as not to effect the overall impedance of the decoupling capacitors. In the preferred embodiment of the present invention, at least one of the first and second links, 70 and 75, emanates from the side of that link's respective bus. Thus, as shown in FIG. 4, link 70 initially protrudes outwardly from $V_{CC}$ bus 63, and subsequently extends downwardly to form a conductive association with plate 53.

Figure 5:
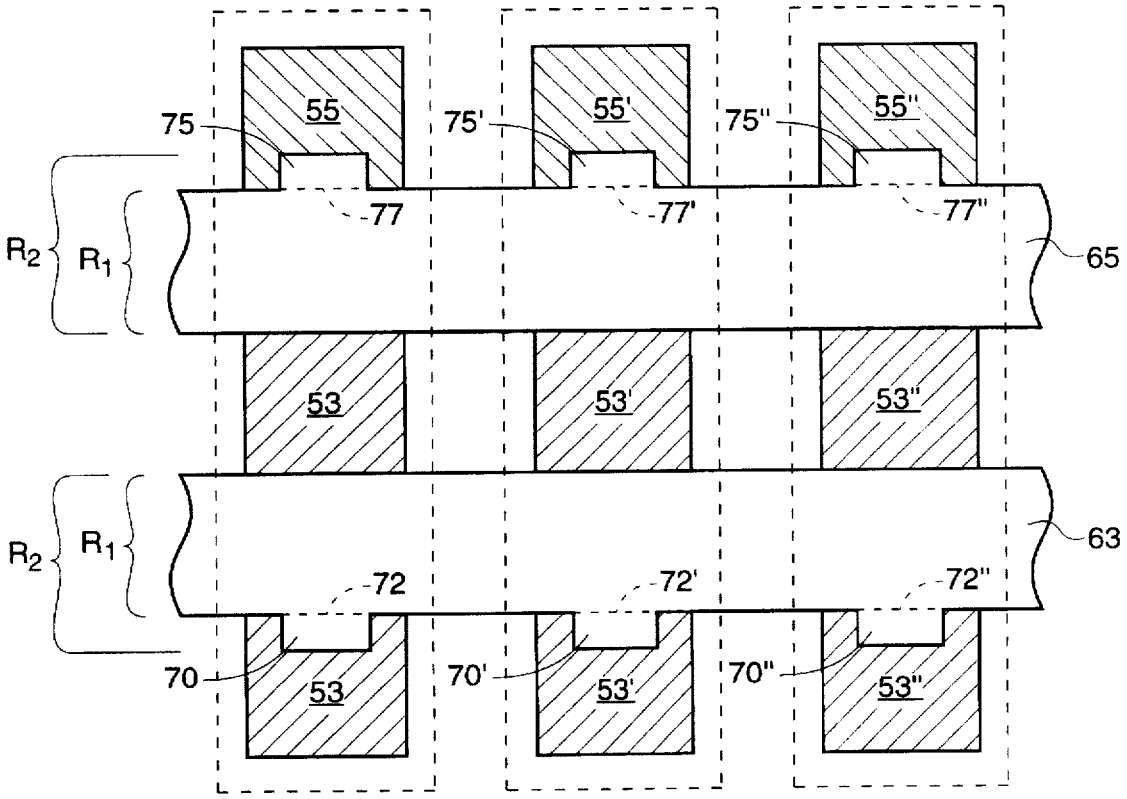
FIG. 5 is a top view of a decoupling capacitor of the present invention.

Referring to FIG. 5, a top view of a decoupling capacitor employing the present invention is depicted. Each decoupling capacitor, 50, 50', and 50", is coupled to $V_{SS}$ bus 65 and $V_{CC}$ bus 63 in parallel. Each capacitor has a dielectric film (not shown), sandwiched between a first and second conductive plate. 53, 53', and 53", and 55, 55', and 55", respectively. Furthermore, $V_{CC}$ bus 63 and $V_{SS}$ bus 65, each having a width $R_1$, are connected to conductive plates, 53, 53', and 53", and 55, 55', and 55", by links 70, 70', and 70", and 75, 75', and 75", at points 72, 72', and 72", and 77, 77', and 77", respectively. In the preferred embodiment of the present invention, at least one of the first and second links, 70, 70', and 70", and 75, 75', and 75", emanates from the side of that link's respective bus at points 72, 72', and 72". Hence, links 70, 70', and 70", and 75, 75', and 75" initially protrude outwardly from $V_{CC}$ bus 63 and $V_{SS}$ bus 65, and subsequently extend downwardly to form conductive associations with plates 53, 53', and 53", and 55, 55', and 55", respectively. It is this outward extension of links 70, 70', and 70", and 75, 75', and 75" that forms width $R_2$. Thus, width $R_2$ is the equivalent of width $R_1$ plus the width of the outward extension.

By the above configuration, first and second links 70, 70', and 70", and 75, 75', and 75" are directly accessible to light emissions. This becomes critical in the event that one or all of decoupling capacitors 50, 50', and 50", should short and fail. As is traditionally the case with the marketing of semiconductor chips, each chip is stressed prior to sale. This stressing is performed by several methods. In the preferred embodiment of the present invention, the chip is tested through a processing step commonly referred to as "burn in." Burn in provides a means for evaluating the degree of resiliency and life span of the chip. In burn in, the chip is heated by means of a heating element by positioning the chip in a chamber at a temperature substantially in the range between 120° C. and 140° C. for a time substantially in the range between 1 hour and 48 hours. Furthermore, the chip is also tested during burn in through a high voltage stress testing element for stressing the chip between the $V_{SS}$ bus and $V_{CC}$ bus at a voltage between 7 Volts and 8 Volts for a time period substantially between 1 minute and 48 hours. In an alternate embodiment, the tester solely comprises a voltage stress testing element for stressing the chip between the $V_{SS}$ bus and $V_{CC}$ bus at a voltage between 7 Volts and 8 Volts for a time period substantially between 1 minute and 48 hours.

Upon completing either stressing step, the operability of each decoupling capacitor is made apparent. Decoupling capacitors which are inoperative emit infrared light after shorting as a result of either of the alternatives for stressing the chip. Thus, by means of an infrared sensor, such as an emission microscope for multilevel inspection ("EMMI"), a decoupling capacitor which has shorted can be detected. As such, utilizing an EMMI, the coordinates of inoperative decoupling capacitor(s) can be ascertained and stored.

Currently, semiconductor chips with inoperative decoupling capacitors are discarded. However, utilizing the present invention, first and second links 70, 70', and 70", and 75, 75', and 75" can be disintegrated, by an external source, thereby decoupling the inoperative decoupling capacitor 50, 50', or 50". As a practical matter, because nearly one hundred decoupling capacitors in parallel are incorporated in every semiconductor chip, decoupling an inoperative decoupling capacitor yields a resultant capacitor at approximately 98–99% of the original value. Given this resultant value, removing one inoperative decoupling capacitor will not substantially change the overall effectiveness of the decoupling circuitry.

Several techniques are available for decoupling the inoperative decoupling capacitor by disintegrating either link through an external source. In the preferred embodiment of the present invention, either link can be disintegrated through directly exposing the outwardly extended portion of the link to light emissions generated by a laser. Nonetheless, other energy forms may be employed. The power necessary from a laser to sufficiently disintegrate the link through this approach is substantially in the range of 0.1 μWatt and 10 mWatt. However, there is a direct relationship between power and the dimensions of the links themselves. A thicker link requires greater power, and vice versa.

In an alternate embodiment of the present invention, either first or second link can be dissolved by applying an acid etch. The acid employed should comprise $H_2SO_4$, $H_2SO_4$ and $H_2O_2$, or $H_2PO_4$. However, when using acid, consideration must be given to the potential damage to the remainder of the chip. As such, only a limited amount of acid can be used. A special applicator may be required to allow for the application of the acid.

The above system for decoupling inoperative decoupling capacitors can also be automated. Once the chip has been subjected to the stressing step, an infrared sensor, preferably comprising an EMMI, can be positioned within or outside the chamber to detect and record the position of any inoperative capacitors. The coordinates and position of the failed capacitor are then stored within a computer for later retrieval. Subsequently, the inoperative decoupling capacitor is exposed to a laser in either the same or a different environment. With the coordinates and position of the inoperative capacitor stored within a computer system, the laser is pinpointed to disintegrate the appropriate link from its respective bus.

Accordingly, a method for decoupling inoperative decoupling capacitors can be formulated. Initially, a semiconductor chip is provided within a chamber. Subsequently, in the preferred embodiment, each chip is stressed by a burn in step. This burn in step comprises exposing the chip to heat at a temperature substantially in the range of 120° C. and 140° C. for approximately 1 hour to 48 hours. Further, the burn in step also comprises applying a voltage between the Vcc bus and the Vss bus substantially in the range of 7 Volts and 8 Volts for a time substantially in the range of 1 minute and 48 hours. In an alternate embodiment, each chip is stressed solely by applying a voltage between the Vcc bus and the Vss bus substantially in the range of 7 Volts and 8 Volts for a time substantially in the range of 1 minute and 48 hours. Decoupling capacitors which are inoperative emit infrared light after shorting as a result of either embodiment. As such, the next step is detecting and recording the position of any inoperative capacitors by means of infrared emission detection. In the event that a decoupling capacitor is detected emitting infrared light, the inoperative part is pinpointed and either of its respective links is disintegrated by an external source. Light energy generated by means of a laser is the preferable method for disintegrating the link. The power necessary to sufficiently disintegrate the link through this approach is substantially in the range of 0.1 μWatt and 10 mWatt. Nonetheless, other energy forms may be employed. Moreover, an acid, comprising $H_2SO_4$, $H_2SO_4$ and $H_2O_2$, or $H_2PO_4$, may also be used.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. For example, the present invention is not limited to a system and method for decoupling inoperative decoupling capacitors, but rather to redundant passive elements. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method for decoupling inoperative elements on a semiconductor chip comprising the steps of:

providing said semiconductor chip having a plurality of redundant passive elements, each of said elements coupled to a bus by means of a link, said bus associated with a predetermined voltage;

testing each of said elements for operability, said testing generating a signal identifying which of said elements are inoperable: and decoupling each of said inoperable elements externally from said bus in response to said signal.

2. A method for decoupling inoperative elements, according to claim 1, wherein at least one of said elements is a decoupling capacitor.

3. A method for decoupling inoperative elements, according to claim 2, wherein said link comprises substantially low resistive characteristics.

4. A method for decoupling inoperative elements, according to claim 3, wherein said predetermined voltage is substantially in the range of 3 Volts and 5 Volts, and said testing comprises the step of:

applying a voltage along said bus substantially in the range of 7 Volts and 8 Volts for a time substantially in the range of 1 minute and 48 hours.

5. A method for decoupling inoperative elements, according to claim 4, wherein said testing further comprises the step of:

heating said semiconductor chip to a temperature substantially in the range of 120° C. and 140° C. for a time substantially in the range 1 hour and 48 hours.

6. A method for decoupling inoperative elements, according to claim 5, wherein said testing further comprises the step of:

sensing a light emission from each of said inoperative elements.

7. A method for decoupling inoperative elements, according to claim 6, wherein said light emission is substantially within the infrared wavelength spectrum.

8. A method for decoupling inoperative elements, according to claim 7, wherein said sensing is accomplished by means of an emission microscope for multilevel inspection.

9. A method for decoupling inoperative elements, according to claim 7, wherein said decoupling comprises the step of:

disintegrating said link of said inoperable element in response to said infrared light emission.

10. A method for decoupling inoperative elements, according to claim 9, wherein said disintegrating is performed by exposing said link to external energy substantially in the range of 0.1 μWatt and 10 mWatt.

11. A method for decoupling inoperative elements, according to claim 10, wherein said external energy is generated by a laser.

12. A method for decoupling inoperative elements, according to claim 9, wherein said disintegrating is performed by means of an acid etch.

13. A method for decoupling inoperative elements, according to claim 12, wherein said acid etch comprises at least one of $H_2SO_4$, $H_2SO_4$ diluted with $H_2O_2$, and $H_2PO_4$.

14. A system for decoupling inoperative elements on a semiconductor chip, the semiconductor chip having a plurality of redundant passive elements, each of said elements coupled to a bus by means of a link, said bus associated with a predetermined voltage; the system comprising:

a. a base for mounting the semiconductor chip, and for providing operative power to the semiconductor chip;

b. means for evaluating the operability of each of said elements, said means for evaluating generating a signal identifying which of said elements are inoperable; and c. means for externally decoupling each of said inoperable elements from said bus by disintegrating said link, said means for externally decoupling responsive to said signal.

15. A system for decoupling inoperative elements, according to claim 14, where said link comprises substantially low resistive characteristics and is accessible to light.

16. A system for decoupling inoperative elements, according to claim 15, wherein at least one of said elements is a decoupling capacitor.

17. A system for decoupling inoperative elements, according to claim 16, wherein said predetermined voltage is substantially in the range of 3 Volts and 5 Volts, and said means for evaluating comprises a stressing element coupled to said bus for applying a voltage substantially in the range of 7 Volts and 8 Volts for a time substantially in the range of 1 minute and 48 hours.

18. A system for decoupling inoperative elements, according to claim 17, wherein said means for evaluating comprises a heating element for heating said semiconductor chip to a temperature substantially in the range between 120° C. and 140° C. for a time substantially in the range between 1 hour and 48 hours.

19. A system for decoupling inoperative elements, according to claim 18, wherein said means for evaluating comprises a sensor for sensing a light emission from each of said inoperative elements.

20. A system for decoupling inoperative elements, according to claim 19, wherein said light emission is substantially within the infrared wavelength spectrum.

21. A system for decoupling inoperative elements, according to claim 20, wherein said sensor comprises an emission microscope for multilevel inspection.

22. A system for decoupling inoperative elements, according to claim 20, wherein said means for externally decoupling comprises a generator for generating energy externally, substantially in the range of 0.1 μWatt and 10 mWatt, to disintegrate said link in response to said infrared light emission.

23. A system for decoupling inoperative elements, according to claim 22, wherein said generator comprises a laser.

24. A system for decoupling inoperative elements, according to claim 20, wherein said means for externally decoupling comprises an applicator for applying acid to disintegrate said link in response to said infrared light emission.

25. A system for decoupling inoperative elements, according to claim 24, wherein said acid comprises at least one of $H_2SO_4$, $H_2SO_4$ diluted with $H_2O_2$, and $H_2PO_4$.

26. An automated system for decoupling inoperative capacitors on a semiconductor chip, the semiconductor chip having a plurality of redundant capacitors, each of said capacitors coupled to a bus by a link, said bus associated with a predetermined voltage, said link comprising substantially low resistive characteristics and being accessible to light emissions; the system comprising:

a. means for testing the operability of each of said capacitors, said means for testing generating an infrared signal identifying which of said capacitors are inoperative, said means for testing comprising:

(1) a heating element for heating said semiconductor chip to a temperature substantially in the range between 120° C. and 140° C. for a time substantially in the range between 1 hour and 48 hours;

(2) a stressing element coupled to said bus for applying substantially in the range of 7 Volts and 8 Volts for a time substantially in the range of 1 minute and 48 hours; and b. a sensor for sensing said infrared signal from each of said inoperative capacitors; and c. a laser for externally decoupling each of said inoperative capacitors from said bus by disintegrating said link, said laser responsive to said signal and having a power range substantially between 0.1 μWatt and 10 mWatt.

*27. A method for decoupling a passive element coupled to a conductor through a link, the method comprising:*

*providing the passive element, conductor, and link on a semiconductor chip;*

*testing the passive element for operability;*

*responsive to inoperability of the passive element, generating a signal identifying the passive element as inoperable;*

*sensing the identifying signal; and*

*decoupling the inoperable passive element externally from the chip in response to the identifying signal.*

*28. The method of claim 27, wherein the step of testing the passive element for operability comprises applying a voltage to the conductor.*

*29. The method of claim 27, wherein the step of providing the conductor on the chip comprises providing the conductor on the chip in association with an operating voltage, wherein the step of testing the passive element for operability comprises applying a voltage to the conductor that is substantially greater than the operating voltage.*

*30. The method of claim 29, wherein the operating voltage is in a range between 3 Volts and 5 Volts, wherein the step of applying the voltage to the conductor comprises applying the voltage to the conductor substantially in a range between 7 Volts and 8 Volts for a period of time up to 48 hours.*

*31. The method of claim 27, wherein the step of testing the passive element for operability comprises heating the semiconductor chip.*

*32. The method of claim 31, wherein the step of heating the semiconductor chip comprises heating the semiconductor chip to a temperature substantially in a range between 120° C. and 140° C. for a period of time up to 48 hours.*

*33. The method of claim 27, wherein the step of generating the signal identifying the passive element as inoperable comprises generating an electromagnetic emission from the inoperable passive element.*

*34. The method of claim 33, wherein the generated electromagnetic emission is substantially within the light spectrum.*

*35. The method of claim 27, wherein the step of sensing the identifying signal comprises sensing the identifying signal with an emission microscope for multilevel inspection.*

*36. The method of claim 27, wherein the step of decoupling the inoperable passive element comprises disintegrating the link in response to the identifying signal.*

*37. The method of claim 36, wherein the step of disintegrating the link comprises exposing the link to external energy sufficient to disintegrate the link.*

*38. The method of claim 37, wherein the step of exposing the link to external energy comprises exposing the link to external energy substantially in a range between 0.1 μWatt and 10 mWatt.*

*39. The method of claim 37, wherein the step of exposing the link to external energy comprises exposing the link to a laser beam.*

*40. The method of claim 36, wherein the step of disintegrating the link comprises etching the link away with an etchant.*

*41. The method of claim 40, wherein the etchant comprises at least one of $H_2SO_4$, $H_2SO_4$ diluted with $H_2O_2$, and $H_2PO_4$.*

*42. The method of claim 27 wherein the steps of testing, sensing, and decoupling are automated.*

*43. A method for decoupling inoperable passive elements from a conductor, the method comprising:*

*providing on a semiconductor chip the conductor coupled to each of a plurality of passive elements on the chip through one of a plurality of links on the chip;*

*testing the passive elements for operability;*

*responsive to inoperability of some of the passive elements, generating a signal associated with each inoperable passive element identifying the location on the chip of the inoperable passive element;*

*sensing each inoperable passive element's associated location identifying signal;*

*determining each inoperable passive element's location from its associated location identifing signal;*

*locating each inoperable passive element in accordance with its determined location; and*

*destroying the link coupled to each located inoperable passive element from a position external to the chip.*

*44. The method of claim 43, wherein the step of testing the passive elements for operability comprises applying a voltage to the conductor.*

*45. The method of claim 43, wherein the step of providing the conductor comprises providing the conductor in association with an operating voltage, wherein the step of testing the passive elements for operability comprises applying a voltage to the conductor that is substantially greater than the operating voltage.*

*46. The method of claim 45, wherein the operating voltage is in a range between 3 Volts and 5 Volts, wherein the step of applying the voltage to the conductor comprises applying the voltage to the conductor substantially in a range between 7 Volts and 8 Volts for a period of time up to 48 hours.*

*47. The method of claim 43, wherein the step of testing the passive elements for operability comprises heating the semiconductor chip.*

*48. The method of claim 47, wherein the step of heating the semiconductor chip comprises heating the semiconductor chip to a temperature substantially in a range between 120° C. and 140° C. for a period of time up to 48 hours.*

*49. The method of claim 43, wherein the step of generating the location identifying signal associated with each inoperable passive element comprises generating an electromagnetic emission from each inoperable passive element.*

*50. The method of claim 49, wherein the generated electromagnetic emissions are substantially within the light spectrum.*

*51. The method of claim 43, wherein the step of sensing each inoperable passive element's location identifying signal comprises sensing each inoperable passive element's location identifying signal with an emission microscope for multilevel inspection.*

*52. The method of claim 43, further comprising storing each inoperable passive element's location in a computer memory.*

*53. The method of claim 43, wherein the step of destroying the link coupled to each located inoperable passive element comprises exposing each link to external energy sufficient to disintegrate each link.*

*54. The method of claim 53, wherein the step of exposing each link to external energy comprises exposing each link to external energy substantially in a range between 0.1 μWatt and 10 mWatt.*

*55. The method of claim 53, wherein the step of exposing each link to external energy comprises exposing each link to a laser beam.*

*56. The method of claim 43, wherein the step of destroying the link coupled to each located inoperable passive element comprises etching each link away with an etchant.*

*57. The method of claim 56, wherein the etchant comprises at least one of $H_2SO_4$, $H_2SO_4$ diluted with $H_2O_2$, and $H_2PO_4$.*

*58. The method of claim 43 wherein the steps of testing, determining, locating, and destroying are automated.*

*59. A system for decoupling an inoperable passive element on a semiconductor chip from a conductor on the chip, the passive element being coupled to the conductor through a link, the system comprising:*

*an evaluator for evaluating the operability of the passive element and for receiving a signal generated by the passive element identifying the passive element as inoperable; and*

*decoupler external to the chip for decoupling the inoperable passive element from the conductor by disintegrating the link in response to the identifying signal.*

*60. The system of claim 59, wherein the evaluator comprises a stressing element coupled to the conductor for applying a voltage thereto.*

*61. The system of claim 60, wherein the conductor is associated with an operating voltage, wherein the voltage applied to the conductor is substantially greater than the operating voltage.*

*62. The system of claim 61 wherein the operating voltage is in a range between 3 Volts and 5 Volts, wherein the voltage applied to the conductor is in a range between 7 Volts and 8 Volts.*

*63. The system of claim 59, wherein the evaluator comprises a heating element for heating the semiconductor chip.*

*64. The system of claim 63, wherein the heating element heats the semiconductor chip to a temperature substantially in a range between 120° C. and 140° C. for a period of time up to 48 hours.*

*65. The system of claim 59, wherein the evaluator comprises a sensor for receiving an electromagnetic emission from the passive element identifying the passive element as inoperable.*

*66. The system of claim 65, wherein the received electromagnetic emission is substantially within the light spectrum.*

*67. The system of claim 59, wherein the decoupler comprises a generator for generating energy externally from the chip to disintegrate the link in response to the identifying signal.*

*68. The system of claim 67, wherein the generator generates energy substantially in a range between 0.1 μWatt and 10 mWatt.*

*69. The system of claim 67, wherein the generator comprises a laser generator.*

*70. The system of claim 59, wherein the decoupler comprises an applicator for applying an etchant to disintegrate the link in response to the identifying signal.*

*71. The system of claim 70, wherein the etchant comprises at least one of $H_2SO_4$, $H_2SO_4$ diluted with $H_2O_2$, and $H_2PO_4$.*

*72. The system of claim 59, wherein the evaluator comprises an automated sensor for sensing the identifying signal, determining the inoperable passive element's location therefrom, and storing the determined location.*

*73. The system of claim 72, wherein the decoupler is coupled to the evaluator, wherein the decoupler comprises an automated decoupler responsive to the stored location of the inoperable passive element for disintegrating the link.*

*74. A recovery system for recovering a semiconductor die made at least partially inoperable by an inoperable passive element shorting first and second conductors on the die together, the system comprising:*

*a link coupled in series with the inoperable passive element between the first and second conductors;*

*a tester for determining the inoperable status of the inoperable passive element; and*

*a decoupler responsive to the tester for destroying the link to interrupt the shorting together of the conductors.*

*75. The recovery system of claim 74, wherein the link comprises a material of minimal electrical resistance.*

*76. The recovery system of claim 74, wherein the tester comprises an emission microscope for multilevel inspection.*

*77. The recovery system of claim 74, wherein the decoupler is selected from a group comprising a laser and an etchant.*

* * * * *